United States Patent
Chung et al.

(10) Patent No.: US 7,691,699 B2
(45) Date of Patent: Apr. 6, 2010

(54) TRANSISTOR FOR SEMICONDUCTOR DEVICE AND METHOD OF FORMING THE SAME

(75) Inventors: Sung Woong Chung, Gyeonggi-do (KR); Sang Don Lee, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 339 days.

(21) Appl. No.: 11/321,537

(22) Filed: Dec. 30, 2005

(65) Prior Publication Data

US 2007/0012997 A1 Jan. 18, 2007

(30) Foreign Application Priority Data

Jul. 15, 2005 (KR) .................. 10-2005-0064235

(51) Int. Cl.
*H01L 21/8238* (2006.01)
(52) U.S. Cl. .............. 438/212; 438/259; 438/270; 438/271; 438/292; 257/329; 257/330; 257/331; 257/E21.648
(58) Field of Classification Search ......... 257/329–331, 257/368, E21.648; 438/212, 259, 270, 271
See application file for complete search history.

(56) References Cited

U.S. PATENT DOCUMENTS

| 2004/0036118 | A1* | 2/2004 | Abadeer et al. | 257/347 |
| 2004/0150071 | A1* | 8/2004 | Kondo et al. | 257/623 |
| 2005/0173759 | A1* | 8/2005 | Kim et al. | 257/331 |
| 2005/0285204 | A1* | 12/2005 | Kim et al. | 257/368 |
| 2007/0063253 | A1* | 3/2007 | Choi | 257/315 |

FOREIGN PATENT DOCUMENTS

KR 1020050065152 A 6/2005

* cited by examiner

*Primary Examiner*—M. Wilczewski
*Assistant Examiner*—Telly D Green
(74) *Attorney, Agent, or Firm*—Townsend and Townsend and Crew LLP

(57) ABSTRACT

Disclosed herein is a transistor for a semiconductor device and a method of forming the same. According to the present invention, a recess channel region is formed on a cell region to increase a channel length and a fin-type channel region is simultaneously formed on a peripheral circuit region to increase a channel area so as to simplify process steps, thereby improving the yield and productivity for manufacturing a semiconductor device.

19 Claims, 9 Drawing Sheets

TRANSISTOR FOR SEMICONDUCTOR DEVICE AND METHOD OF FORMING THE SAME

BACKGROUND OF THE INVENTION

1. Field of the Invention

The present invention relates to a memory device. In particular, the present invention provides a transistor for a semiconductor device and a method of forming the same, and more specifically to a transistor for a semiconductor device and a method of forming the same wherein a recess channel region is formed on a cell region to increase a channel length and a fin-type channel region is simultaneously formed on a peripheral circuit region to increase a channel area so as to simplify process steps, thereby improving the yield and productivity for manufacturing a semiconductor device.

2. Discussion of the Related Art

Recently, there has been a trend in demanding a transistor having sufficient drive current and lower power in order to increase its operating speed even though design rules of a semiconductor device are reduced. Channel area is one considerable factor for determining drive current a transistor for a semiconductor device. In a conventional transistor for a semiconductor device decreasing the design rules, a fin-type channel region is one of solutions for decrease in its drive current. In particular, it is expected that in case of a peripheral circuit region of DRAM, the fin-type channel region be formed to improve a short-channel effect and increase the drive current.

FIGS. 1 and 2 is layout views of a conventional transistor for a semiconductor device, and FIGS. 3A through 3C are cross-sectional views illustrating a conventional method of forming a transistor for a semiconductor device.

FIG. 1 is a layout view showing the peripheral circuit region of a conventional DRAM, and shows an active region 15 having a substantially large width on a semiconductor substrate 10 and a device isolation film 30 defining the active region 15.

FIG. 2 is a layout view showing a plurality of separate active regions 15 in order to form a fin-type channel region on a peripheral circuit region of the semiconductor substrate 10, and shows the active region 15 spaced apart from its neighboring active region 15 by a predetermined distance and a device isolation film 30 defining the plurality of active regions 15.

FIGS. 3A through 3C are cross-sectional views illustrating a conventional method of forming a transistor for a semiconductor device, wherein FIGS. 3A through 3C are taken along the line I-I' shown in FIG. 2.

Referring to FIG. 3A, a pad oxide film (not shown) and a pad nitride film (not shown) are sequentially formed on a semiconductor substrate 10, and then the pad oxide film and the pad nitride film are etched using a device isolation mask as an etching mask to form a stacked structure of a pad oxide film pattern 17 and a pad nitride film pattern 20 defining a device isolation region. Next, the exposed semiconductor substrate 10 is etched using the stacked structure of the pad oxide film pattern 17 and the pad nitride film pattern 20 as an etching mask by a predetermined thickness to form a trench (not shown) defining an active region 15 shown in FIG. 2. Thereafter, a liner oxide film 23 and a liner nitride film 25 are formed on sidewalls of the trench, and then an oxide film (not shown) for a device isolation film is formed filling up the trench. After that, the oxide film is planarized until the pad nitride film pattern 20 is exposed so as to form a device isolation film 30.

Referring to FIG. 3B, the pad nitride film pattern 20 and the pad oxide film pattern 17 are removed, and then a mask pattern (not shown) defining a recess 35 shown in FIG. 2 is formed on the entire surface of the semiconductor substrate 10. Next, the device isolation film 30 is etched using the mask pattern as an etching mask by a predetermined thickness to form a plurality of protruding active regions. Thereafter, the mask pattern is removed.

Referring to FIG. 3C, the plurality of protruding active regions is implanted with impurity ions to form a fin-type channel region (not shown), and then a gate oxide film 40 is formed on the surface of the fin-type channel region. Next, a gate structure 50 is formed on a gate region 5 shown in FIG. 2.

However, according to the conventional transistor and method of forming the same, a mask process for forming a fin-type channel region on a peripheral circuit region differs from that for forming a recess gate on a cell region, and a plurality of separate active regions must be formed on the semiconductor substrate in order to the fin-type channel region. As a result, it must have a further mask and etching process. Accordingly, there is a problem of increasing product cost and decreasing yield for the semiconductor device due to increase in the process steps.

SUMMARY OF THE INVENTION

According to the present invention, techniques for forming a memory device are provided. In particular, the present invention provides a transistor for a semiconductor device and a method of forming the same. More specifically, the present invention provides a transistor for a semiconductor device and a method of forming the same wherein a recess channel region is formed on a cell region to increase a channel length and a fin-type channel region is simultaneously formed on a peripheral circuit region to increase a channel area so as to simplify process steps, thereby improving the yield and productivity for manufacturing a semiconductor device. Although the present invention has been applied to a specific memory device, there can be other applications.

In order to achieve the above advantage, in an embodiment of the present invention, a transistor for a semiconductor device includes a device isolation film formed on a peripheral circuit region of a semiconductor substrate, the device isolation film defining a fin-type active region; a plurality of recesses disposed on the fin-type active region; and a gate structure formed on each of the plurality of recesses.

Preferably, a thickness of the device isolation film ranges from 200 nm to 2000 nm. The recess is preferably formed by etching the semiconductor substrate by a predetermined thickness ranging from 50 nm to 1000 nm, and the recess is preferably spaced apart from its neighboring recess by a predetermined distance ranging from 20 nm to 500 nm. The recess is preferably in shape of a circle type, an elliptical type, a line type, a rectangular type or combinations thereof. Also, the gate structure preferably comprises a stacked structure of a gate insulating film and a gate conductive layer. The gate insulating film is preferably formed of a silicon oxide film, a hafnium oxide film, an aluminum oxide film, a zirconium oxide film, a silicon nitride film or combinations thereof. A thickness of the gate insulating film preferably ranges from 1 nm to 10 nm. Preferably, the transistor for a semiconductor device further includes source/drain regions disposed at both sides of the gate structure.

In another embodiment of the present invention, a method of forming a transistor for a semiconductor device includes the steps of: (a) forming a device isolation film defining a fin-type active region on a peripheral circuit region of a semiconductor substrate; (b) etching the fin-type active region by a predetermined thickness to form a plurality of recesses; (c) forming a gate insulating film on the fin-type active region, and then forming a gate conductive layer filling up each of the plurality of recesses on the semiconductor substrate; and (d) etching the gate conductive layer using a gate mask as an etching mask to form a gate.

Preferably, a thickness of the device isolation film ranges from 200 nm to 2000 nm. In addition, the predetermined thickness in step (b) preferably ranges from 50 nm to 1000 nm, and the recess is preferably spaced apart from its neighboring recess by a predetermined distance ranging from 20 nm to 500 nm. The recess is preferably in shape of a circle type, an elliptical type, a line type, a rectangular type or combinations thereof. Also, the gate insulating film is preferably formed of a silicon oxide film, a hafnium oxide film, an aluminum oxide film, a zirconium oxide film, a silicon nitride film or combinations thereof in its thickness of ranging from 1 to 10 nm. The gate conductive layer preferably is a polysilicon layer formed by a CVD method. Further, the polysilicon layer is preferably a doped polysilicon having impurities of P, B or a combination thereof. Preferably, the method of forming a transistor for a semiconductor device further includes a step of implanting impurity ions at both sides of the gate to form source/drain regions, after step (d).

DETAILED DESCRIPTION OF THE EXEMPLARY EMBODIMENTS

Reference will now be made in detail to exemplary embodiments of the present invention. Wherever possible, the same reference numbers will be used throughout the drawings to refer to the same or like parts. It should be appreciated that the embodiments are provided for the purpose that one ordinarily skilled in the art would be able to understand the present invention, and modifications in various manners and the scope of the present invention are not limited by the embodiments described herein.

Figure 1:
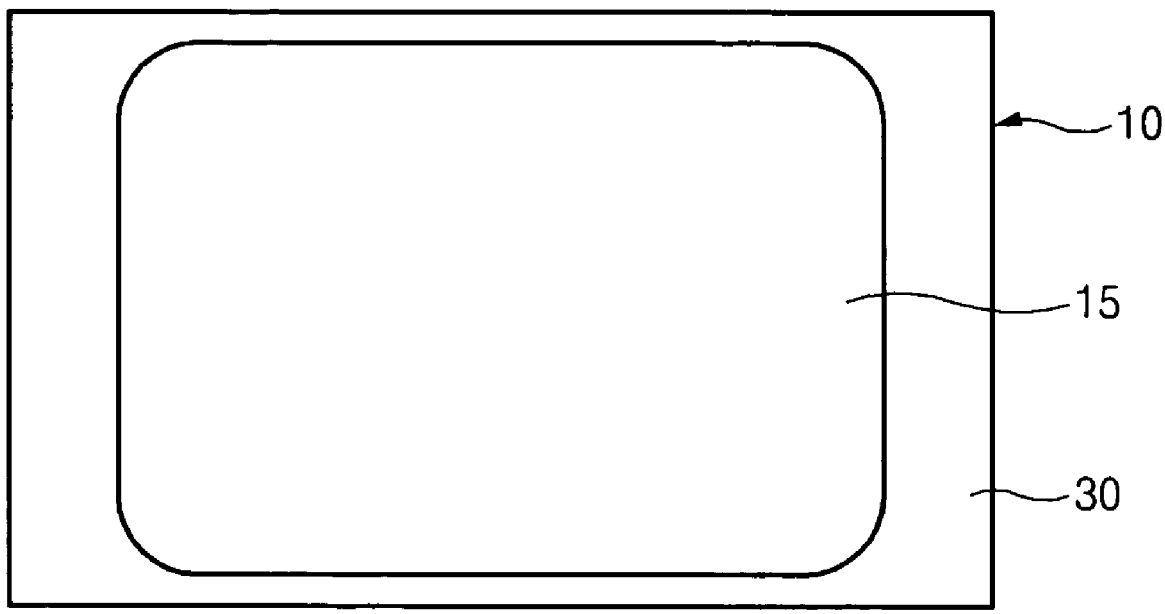
FIGS. 1 and 2 are simplified layout views of a conventional transistor for a semiconductor device.
Figure 2:
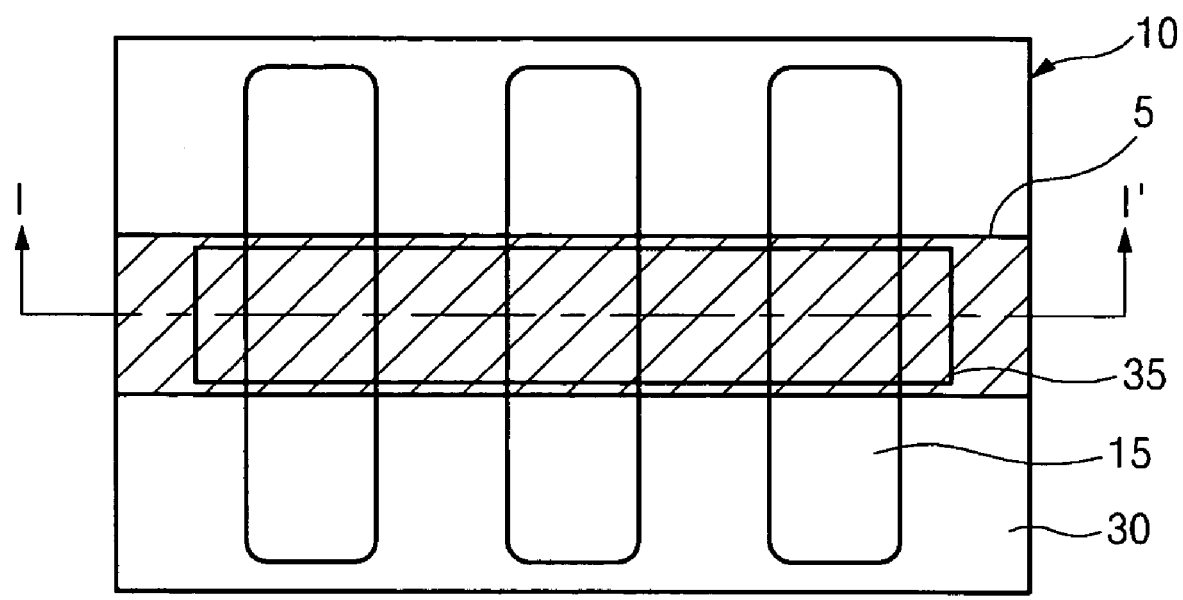
Figure 3A:
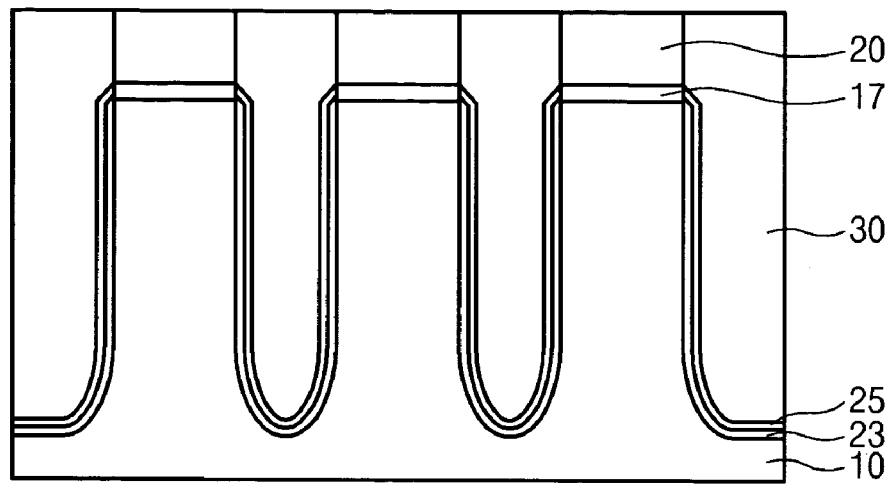
FIGS. 3A through 3C are simplified cross-sectional views illustrating a conventional method of forming a transistor for a semiconductor device.
Figure 3B:
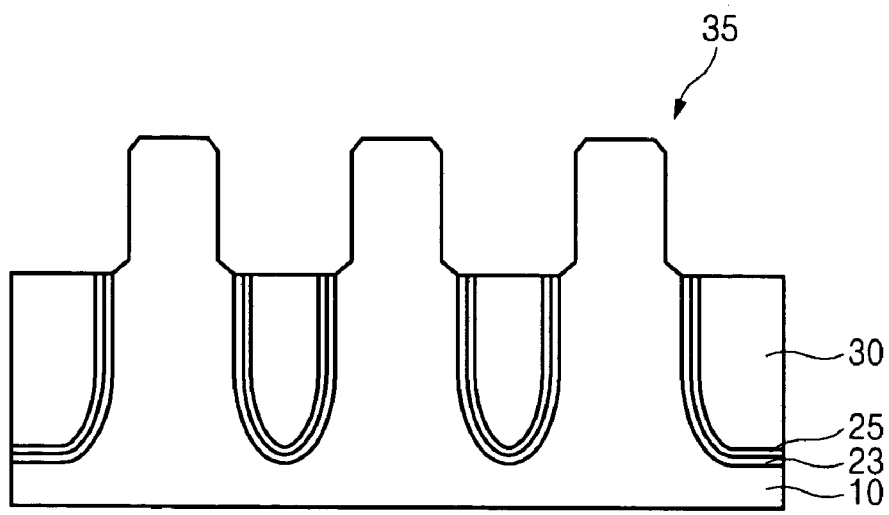
Figure 3C:
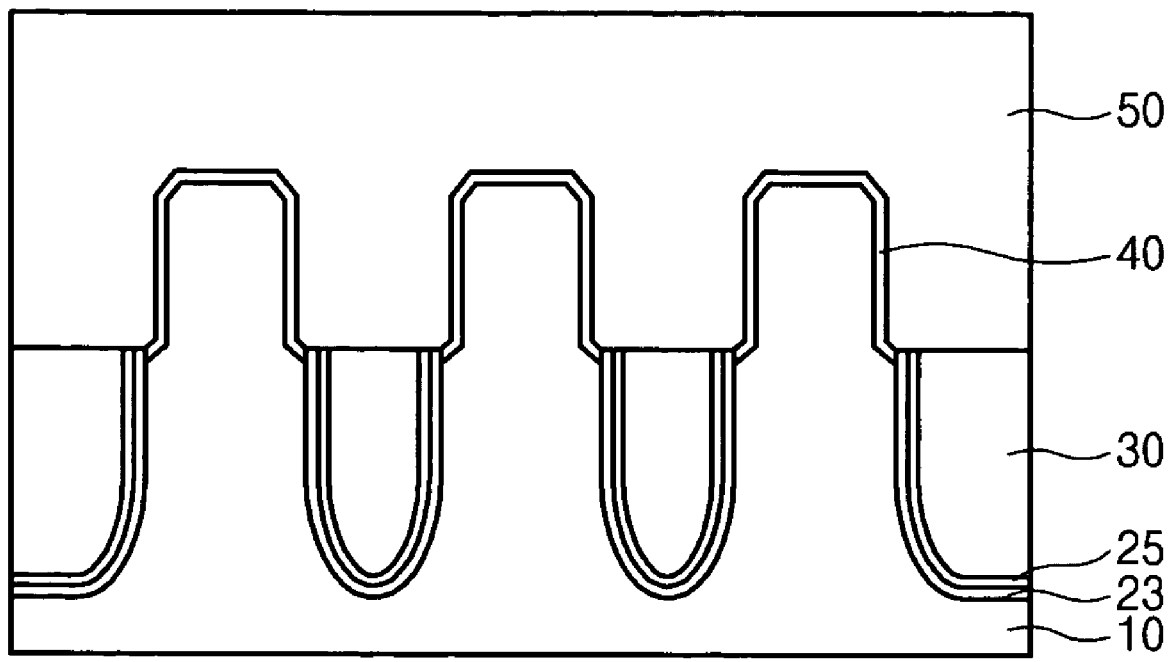
Figure 4:
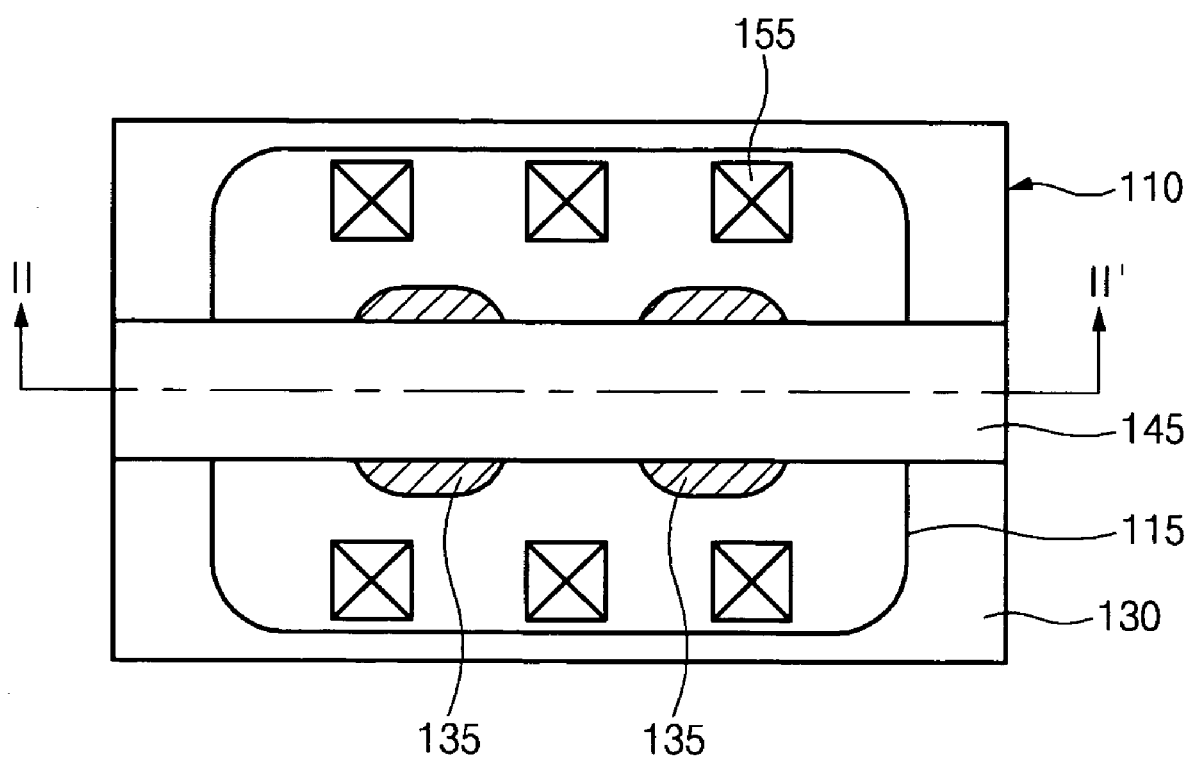
FIG. 4 is a simplified layout view of a transistor for a semiconductor device in accordance with an embodiment of the present invention.
Figure 6:
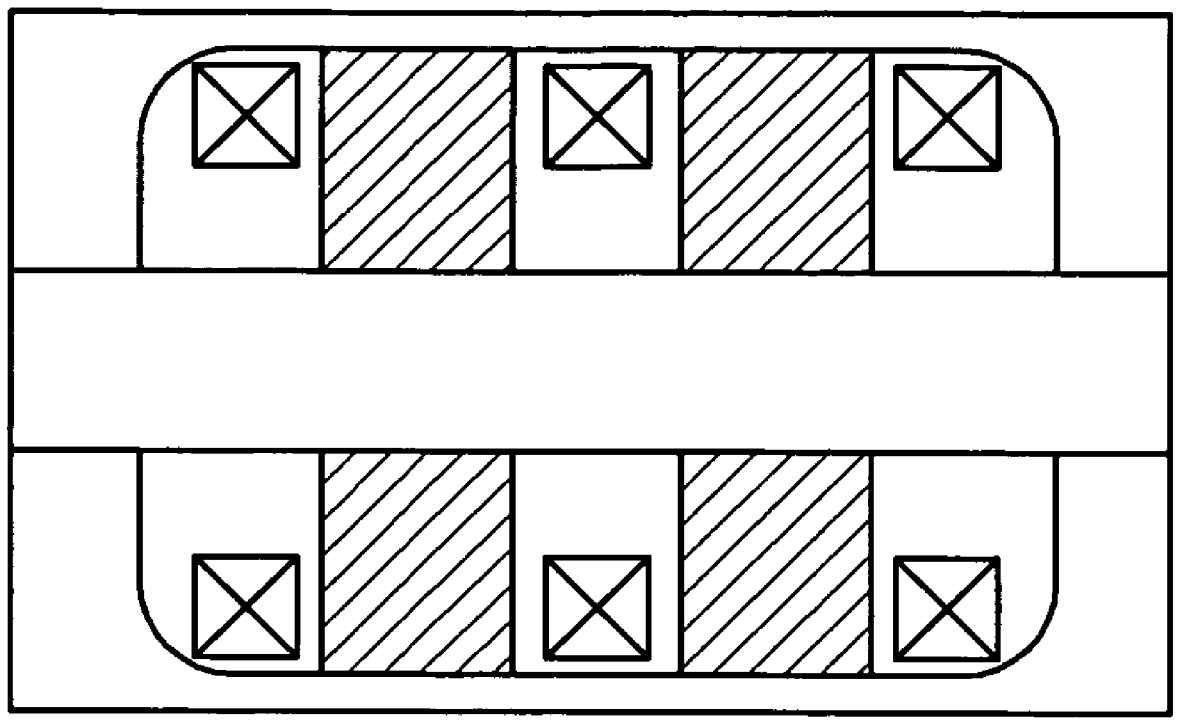
FIGS. 6 and 7 are respectively simplified layout views of a transistor for a semiconductor device in accordance with other embodiments of the present invention.
Figure 7:
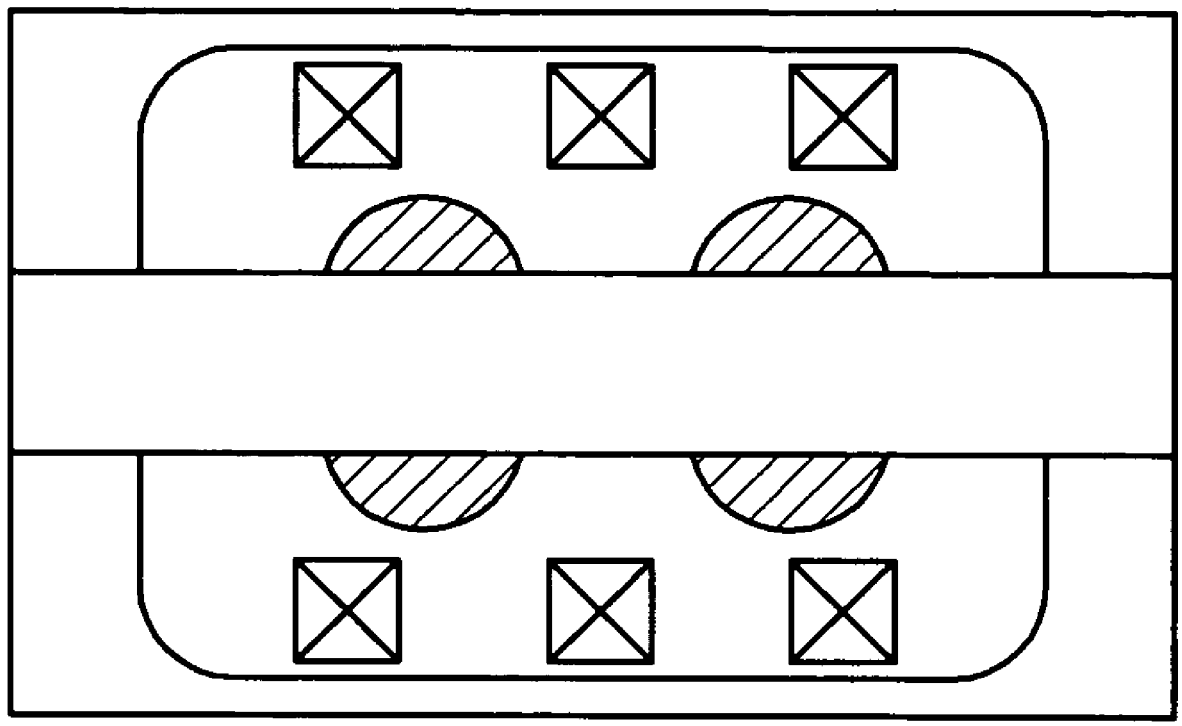

FIG. 4 is a simplified layout view of a transistor for a semiconductor device according to a first embodiment of the present invention. FIGS. 5A through 5D are simplified cross-sectional views illustrating a method of forming a transistor for a semiconductor device in accordance with a first embodiment of the present invention. In addition, FIGS. 6 and 7 are simplified layout views of a transistor for a semiconductor device in accordance with a second and third embodiments of the present invention.

Referring to FIG. 4, according to the first embodiment of the present invention, a device isolation film 130 defining a fin-type active region 115 is formed on a peripheral circuit region of a semiconductor substrate 110, a plurality of recesses 135 are disposed on the fin-type active region 115 and a gate structure 145 is formed on each of the plurality of recesses 135. In addition, source/drain regions 155 are disposed at both sides of the gate structure 145. At this point, the plurality of recesses 135 is preferably formed by etching the fin-type active region 115 underlying the gate structure 145 by a predetermined thickness while a recess is formed on a cell region of the semiconductor substrate 110 during an etching process for a recess gate region (not shown). Here, the plurality of recesses 135 is preferably disposed on the fin-type active region 115 underlying the gate structure 145 in its longitude direction. Further, a thickness of the recess 135 preferably ranges from 50 nm and 1000 nm from the surface of the semiconductor substrate 110, and is preferably spaced apart from its neighboring recess 135 by a predetermined distance ranging from 20 nm to 500 nm. In addition, the recess 135 is preferably in shape of a rectangular type whose width is larger than that of the gate structure 145. On the other hand, the longitude direction of the gate structure 145 on the peripheral circuit region of the semiconductor substrate 110 may or not be the same as that of a gate structure (not shown) on the cell region of the semiconductor substrate 110.

FIGS. 5A through 5D are simplified cross-sectional views illustrating a method of forming a transistor for a semiconductor device according to a first embodiment of the present invention, wherein FIGS. 5A through 5D are taken along the line II-II'.

Figure 5A:
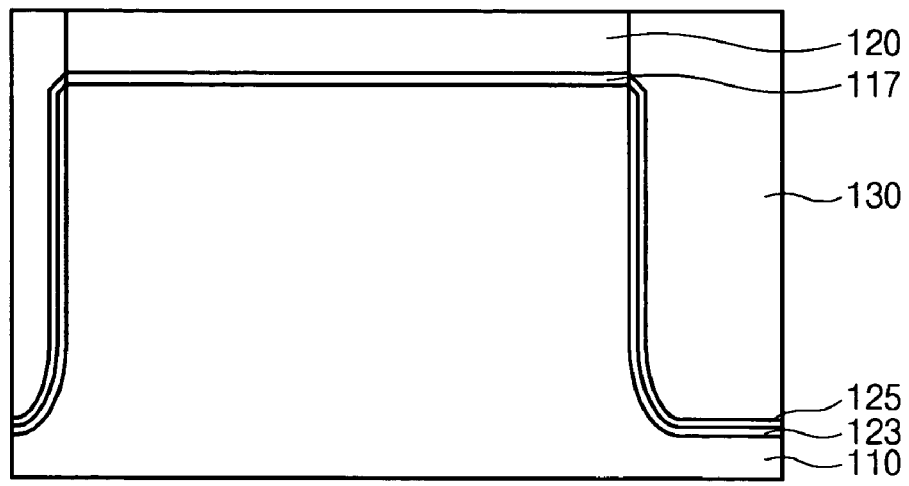
FIGS. 5A through 5D are simplified cross-sectional views illustrating a method of forming a transistor for a semiconductor device in accordance with an embodiment of the present invention.

Referring FIG. 5A, a pad oxide film (not shown) and a pad nitride film (not shown) are sequentially formed on a peripheral circuit region of a semiconductor substrate 110, and then the pad oxide film and the pad nitride film are etched using a device isolation mask as an etching mask to form a stacked structure of a pad oxide film pattern 117 and a pad nitride film pattern 120 defining a device isolation region. Next, the semiconductor substrate 110 is etched using the stacked structure of the pad nitride film pattern 120 and the pad oxide film pattern 117 as an etching mask by a predetermined thickness to form a trench (not shown) defining an active region (not shown). Thereafter, a liner oxide film and a liner nitride film are formed on the surface of the trench. An oxide film (not shown) for a device isolation film filling up the trench is formed on the entire surface of the semiconductor substrate 110, and then the oxide film is planarized until the pad nitride film pattern 120 is exposed so as to form a device isolation film 130. Here, a thickness of the device isolation film 130 preferably ranges from 200 nm to 2000 nm.

Figure 5B:
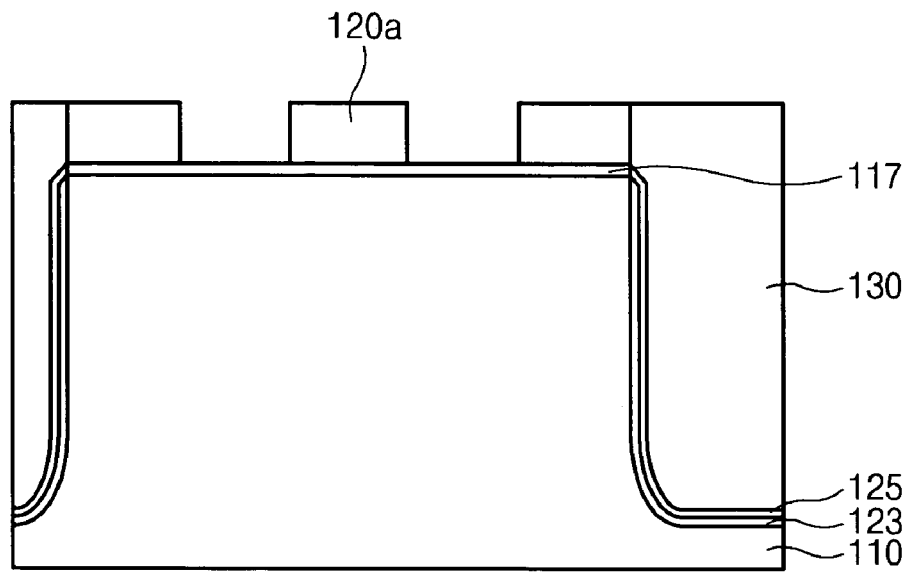

Referring to FIG. 5B, the pad nitride film pattern 120 is etched using a recess mask (not shown) to form a recess pattern 120a defining a plurality of recesses 135 shown in FIG. 4.

Figure 5C:
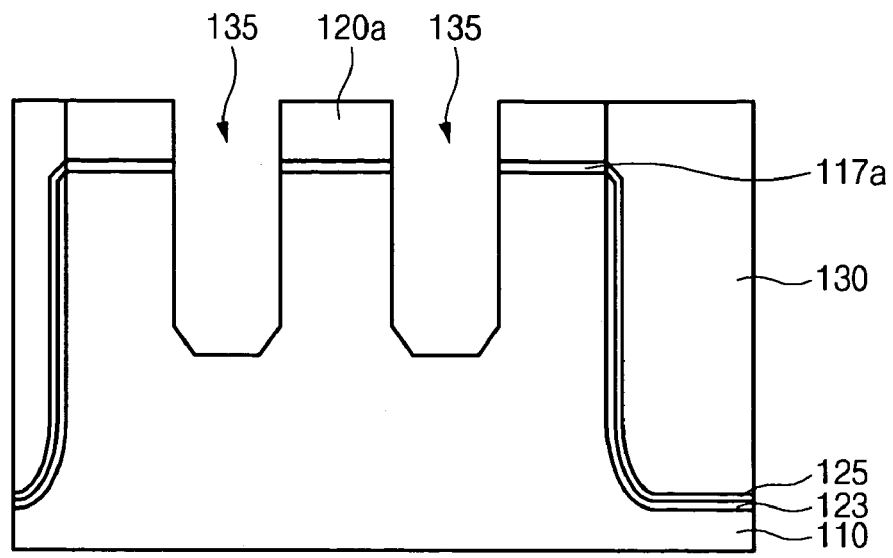

Referring to FIG. 5C, the exposed pad oxide film pattern 117 and the semiconductor substrate 110 are etched using the recess pattern 120a as an etching mask by a predetermined thickness to form a plurality of recesses 135. Preferably, the recess 135 is formed on the peripheral circuit region of the semiconductor substrate 110 while a recess (not shown) is formed on the cell region of the semiconductor substrate 110 during an etching process for a recess gate region. Here, each of the plurality of recesses 135 is preferably disposed on the active region 115 underlying the gate structure 145 shown in FIG. 4. Further, a thickness of the recess 135 from the surface of the semiconductor substrate 110 preferably ranges from 50 nm to 1000 nm, and the recess 135 is preferably spaced apart from its neighboring recess 135 by a predetermined distance ranging from 20 nm to 500 nm. In addition, the recess 135 is preferably in shape of a rectangular type whose width is larger than that of the gate structure 145 shown in FIG. 4.

Figure 5D:
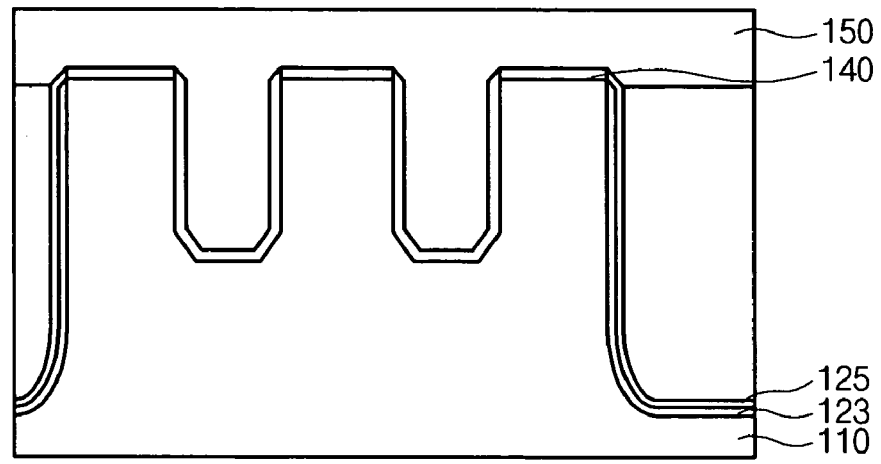

Referring to FIG. 5D, a gate insulating film 140 is formed on the surface of the active region. Next, a gate conductive layer 150 is formed on the entire surface of the semiconductor substrate 110, and then the gate conductive layer 150 is etched using a gate mask (not shown) as an etching mask to form a word line. Thereafter, impurity ions are implanted into the semiconductor substrate 110 at both sides of the word line to form source/drain regions 155 shown in FIG. 4. Here, the gate insulating film 140 is preferably formed of a silicon oxide film, a hafnium oxide film, an aluminum oxide film, a zirconium oxide film, a silicon nitride film or combinations thereof in its thickness of ranging from 1 to 10 nm. In addition, the gate conductive layer 150 is preferably a polysilicon layer formed by a CVD method. Further, the polysilicon layer is preferably a doped polysilicon having impurities of P, B or a combination thereof.

In the subsequent process, the well-known process for fabricating a transistor for a semiconductor device can be performed to completely manufacture a transistor.

According to the first embodiment of the present invention, the length and the width of the channel region in the peripheral circuit region can be increased due to the recess 135 while only the length of the channel region in cell region is increased because of the recess gate region. In order to improve short-channel effect and increase drive current, the recess 135 is simultaneously formed on the peripheral circuit region while the recess is formed on the cell region during the etching process for the recess gate region so as to simplify the process steps and reduce the product cost.

FIGS. 6 and 7 are respectively simplified layout views of a transistor for a semiconductor device in accordance with a second and third embodiments of the present invention.

Referring to FIGS. 6 and 7, the recess for forming a fin-type active region on the peripheral circuit region of the semiconductor substrate is respectively in shape of a line type or an elliptical type instead of a rectangular type so as to obtain an equivalent effect.

As described above, according to the present invention, the recess is formed on a peripheral circuit region to form the fin-type channel having an increased channel area while the recess is formed on the cell region to form the recess channel, thereby simplifying the process steps and reducing the product cost. Accordingly, it provides an effect of improving the yield and productivity for manufacturing a semiconductor device.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A transistor for a semiconductor device comprising:
a device isolation film formed on a peripheral circuit region of a semiconductor substrate, the device isolation film defining a fin-type active region;
two recesses disposed on the fin-type active region;
a gate structure formed on the recesses, wherein the gate structure comprises three fin gates formed on the fin-type active region, each fin gate being adjacent to at least one of the recesses, wherein the device isolation film is adjacent to only the outermost sides of the outermost fin gates;
a fin-type channel region formed on the peripheral circuit region to increase a channel area; and
a recess gate structure having a recess channel region formed on a cell region of the semiconductor substrate to increase a channel length.

2. The transistor according to claim 1, wherein a thickness of the device isolation film ranges from about 200 nm to about 2000 nm.

3. The transistor according to claim 1, wherein the recesses are formed by etching the semiconductor substrate by a predetermined thickness ranging from about 50 nm to about 1000 nm.

4. The transistor according to claim 1, wherein the recesses are spaced apart from neighboring recesses by a predetermined distance ranging from about 20 nm to about 500 nm.

5. The transistor according to claim 1, wherein the recesses are in the shape of a circle type, an elliptical type, a line type, a rectangular type or combinations thereof.

6. The transistor according to claim 1, wherein the gate structure comprises a stacked structure of a gate insulating film and a gate conductive layer.

7. The transistor according to claim 6, wherein the gate insulating film is formed of a silicon oxide film, a hafnium oxide film, an aluminum oxide film, a zirconium oxide film, a silicon nitride film or combinations thereof.

8. The transistor according to claim 6, wherein a thickness of the gate insulating film ranges from about mm to about 10 nm.

9. The transistor according to claim 1, further comprising source/drain regions disposed at both sides of the gate structure.

10. A method of forming a transistor for a semiconductor device, comprising the steps of:
(a) forming a device isolation film defining a fin-type active region on a peripheral circuit region of a semiconductor substrate;
(b) etching the fin-type active region by a predetermined thickness to form two recesses and simultaneously etching a cell region of the semiconductor substrate to form a recess channel region of a recess gate structure;
(c) forming a gate insulating film on the fin-type active region, and then forming a gate conductive layer filling tip each recess; and
(d) etching the gate conductive layer using a gate mask as an etching mask to form a gate structure, wherein the gate structure comprises three fin gates formed on the fin-type active region, each fin gate being adjacent to at least one of the recesses, wherein the device isolation film is adjacent to only the outermost sides of the outermost fin gates.

11. The method according to claim 10, wherein a thickness of the device isolation film ranges from about 200 nm to about 2000 nm.

12. The method according to claim 10, wherein the predetermined thickness in step (b) from the surface of the semiconductor substrate ranges from about 50 nm to about 1000 nm.

13. The method according to claim 10, wherein the recesses are spaced apart from neighboring recess by a predetermined distance ranging from 20 nm to 500 nm.

14. The method according to claim 10, wherein the recesses are in the shape of a circle type, an elliptical type, a line type, a rectangular type or combinations thereof.

15. The method according to claim 10, wherein the gate insulating film is formed of a silicon oxide film, a hafnium oxide film, an aluminum oxide film, a zirconium oxide film, a silicon nitride film or combinations thereof.

16. The method according to claim 10, wherein the gate insulating him thickness ranges from about 1 nm to about 10 nm.

17. The method according to claim 10, wherein the gate conductive layer is a polysilicon layer formed by a CVD method.

18. The method according to claim 17, wherein the polysilicon layer is a doped polysilicon having impurities of P, B or a combination thereof.

19. The method according to claim 17, further comprising a step of implanting impurity ions at both sides of the gate structure to form source/drain regions, after step (d).

* * * * *